US008564287B2

(12) United States Patent
Vanhelmont et al.

(10) Patent No.: US 8,564,287 B2
(45) Date of Patent: Oct. 22, 2013

(54) MAGNETIC FIELD SENSOR (75) Inventors: Frederik Willem Maurits Vanhelmont, Maaseik (BE); Mark Isler, Ellerbek (DE); Andreas Bernardus Maria Jansman, Brabant (NL); Robertus Adrianus Maria Wolters, Eindhoven (NL)

(73) Assignee: NXP B.V., Eindhoven (NL)

( * ) Notice: Subject to any disclaimer, the term of this patent is extended or adjusted under 35 U.S.C. 154(b) by 323 days.

(21) Appl. No.: 13/020,694

(22) Filed: Feb. 3, 2011

(65) Prior Publication Data
US 2011/0187361 A1 Aug. 4, 2011

(30) Foreign Application Priority Data

Feb. 4, 2010 (EP) .................. 10152688

(51) Int. Cl.
*G01R 33/09* (2006.01)
(52) U.S. Cl.
USPC ....................................... 324/252
(58) Field of Classification Search
USPC .................................. 324/207.21, 252
See application file for complete search history.

(56) References Cited

U.S. PATENT DOCUMENTS

| 5,861,328 | A | 1/1999 | Tehrani et al. |
|---|---|---|---|
| 6,048,739 | A | 4/2000 | Hurst et al. |
| 6,289,583 | B1 | 9/2001 | Belmont et al. |
| 6,850,057 | B2 | 2/2005 | Witcraft et al. |
| 7,037,604 | B2 | 5/2006 | Witcraft |
| 7,449,882 | B2 | 11/2008 | Witcraft et al. |
| 2009/0045475 | A1 | 2/2009 | Wan et al. |
| 2010/0184239 | A1* | 7/2010 | Matsuzaki .................. 438/3 |

FOREIGN PATENT DOCUMENTS

| CN | 1252129 A | 5/2000 |
|---|---|---|
| CN | 1672058 A | 9/2005 |
| CN | 1829913 A | 9/2006 |
| WO | 2005/003801 A2 | 1/2005 |
| WO | 2008/120118 A2 | 10/2008 |
| WO | 2009/040693 A2 | 4/2009 |

OTHER PUBLICATIONS

Extended Search Report for European Patent Appln. No. 10152688.7 (Jun. 11, 2010)xxx.

* cited by examiner

*Primary Examiner* — Bot Ledynh (57) ABSTRACT

An MR sensor arrangement is integrated with an IC. A metal layer of the IC structure (e.g. CMOS) is patterned to define at least first and second contact regions. Metal connecting plugs are provided below the first and second contact regions of the metal layer for making contact to terminals of the integrated circuit. A magnetoresistive material layer is above the metal layer and separated by a dielectric layer. Second metal connecting plugs extend up from the metal layer to an MR sensor layer. The sensor layer is thus formed over the top of the layers of the IC structure.

16 Claims, 6 Drawing Sheets

Figure 1

Prior Art

Figure 2

Figure 3 (...cont. on next page)

Prior Art

Figure 3

Prior Art

MAGNETIC FIELD SENSOR

CROSS-REFERENCE TO RELATED APPLICATION

This application claims the priority under 35 U.S.C. §119 of European patent application no. 10152688.7, filed on Feb. 4, 2010, the contents of which are incorporated by reference herein.

The invention relates to magnetic field sensors. In particular, the invention relates to MR (magnetoresistive) sensors such as anisotropic magentoresistive (AMR) sensors.

Magnetic sensors are increasingly important in various industries. In the automotive industry in particular, various sensors such as parking sensors, angular sensors, ABS (Automatic Braking System) sensors and tyre pressure sensors can be found in modern vehicles for improving comfort and safety. Magnetic sensors are particularly important in automotive applications, because magnetic fields penetrate easily through most materials. Magnetic sensors are also highly insensitive to dirt, unlike for example optical sensors.

Several different magnetic sensor technologies are currently available, such as sensors based on the Hall effect or the magnetoresistive effect. Anisotropic magnetoresistive (AMR) and giant magnetoresistive (GMR) sensors are particular examples of sensor types based on the magnetoresistive effect. Hall effect sensors can be integrated monolithically into integrated circuits, which makes them cheap, but they are also known for their low sensitivity and consequent inaccuracy. AMR sensors, while having a much higher sensitivity compared to Hall effect sensors, require more fabrication steps because they cannot be easily integrated monolithically, making a total sensor system more expensive. AMR sensors can be deposited, usually by sputtering of $Ni_{80}Fe_{20}$ on a separate die or on top of a monolithic structure. An annealing process, sometimes in a magnetic field, is often used for increased stabilisation of the magnetic state in the magnetoresistive material.

GMR sensors typically have a higher sensitivity than AMR sensors. However, a GMR sensor consists of various thin layers and critical interfaces. The technology required to fabricate such sensors is considerably more complicated and expensive. Furthermore, due to the thin multiple layers making up a GMR sensor, the operating temperature range is also limited. Therefore often AMR sensors are chosen as a good compromise in magnetic sensor applications.

Figure 1:
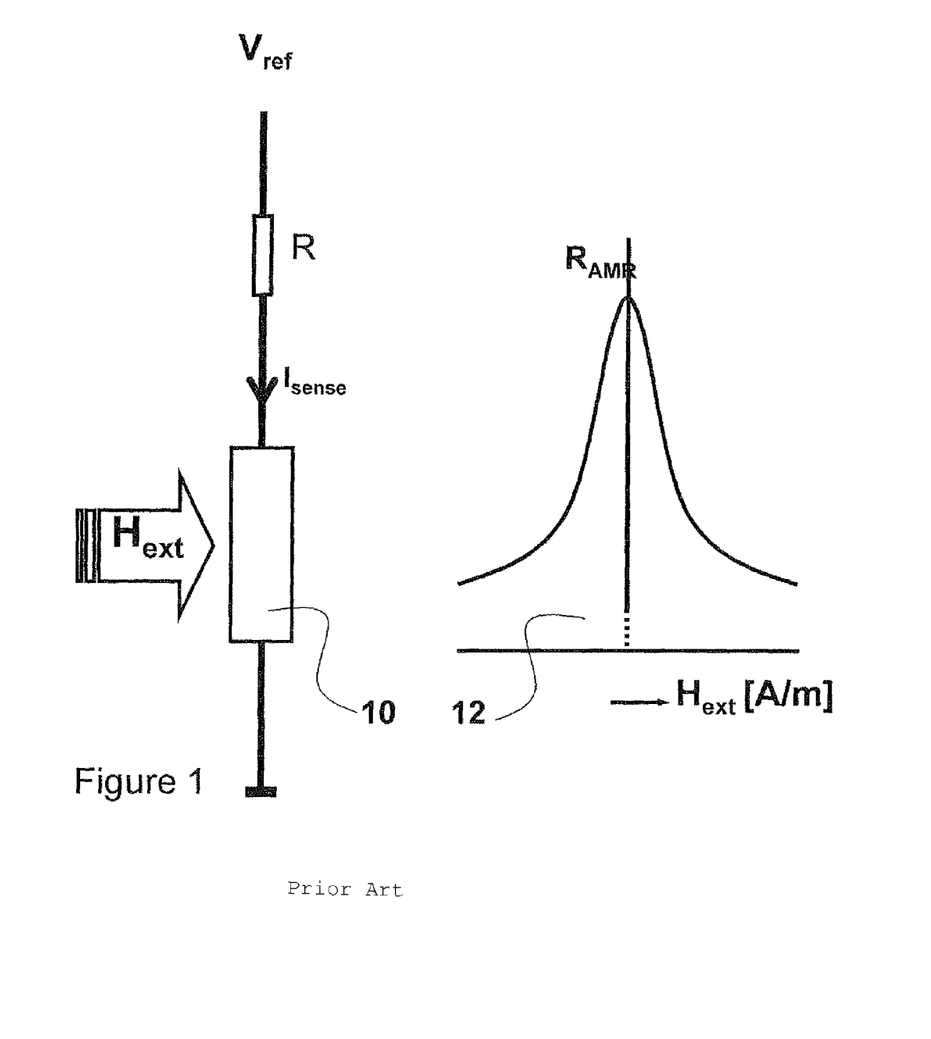
FIG. 1 shows a known AMR sensor and the typical AMR transfer function.

An AMR sensor 10 is sketched in FIG. 1 left. The AMR sensor is supplied by a sense current $I_{sense}$ that can be extracted from for example a reference voltage $V_{ref}$ in series with a resistor R. A typical AMR transfer function 12, defined as the AMR sensor resistance, $R_{AMR}$, as a function of the applied (or external) magnetic field, $H_{ext}$, is displayed in FIG. 1 right. The transfer function is symmetrical with respect to the y-axis and consequently has vanishing sensitivity near the zero crossings of $H_{ext}$. This strongly hampers an accurate detection of zero-field crossings: for such a symmetrical transfer curve, electronic noise and other disturbing electronic signals have a large impact at and around $H_{ext}=0$.

Figure 2:
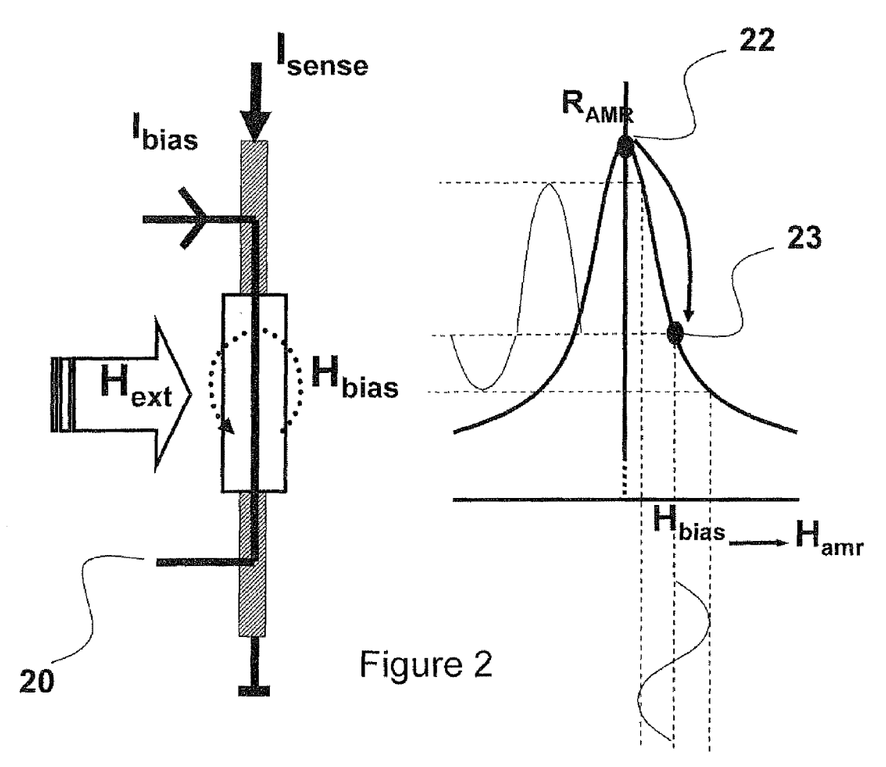
FIG. 2 shows the sensor of FIG. 1 with the addition of a coil on top and the modified AMR transfer function.

One known way to tackle this problem is the addition of a coil 20 on top of the AMR sensor, see FIG. 2 left. When a DC current ($I_{bias}$) is driven through the coil, an additional field $H_{bias}$ is generated in the AMR sensor. The bias point of the AMR sensor is now shifted from 0 (point 22) to $H_{bias}$ (point 23) on the AMR transfer function, see FIG. 2 right. The AMR is now sensitive at zero $H_{ext}$ and its response to a sinusoidal $H_{ext}$ of the AMR sensor might look like the one depicted in FIG. 2 right.

Unfortunately, a difference in positive and negative half periods is visible due to the not purely anti-symmetric transfer curve that is generally obtained by the DC bias. Therefore, the zero-crossings of the external field do not coincide with the average value of the resistance of the sensor. So, this average value can not be used to detect the zero-field crossings. Moreover, the deviation of the actual zero-field crossings from this average AMR resistance level depends from the amplitude of the external field (and also from the size of the bias field, the shape of the transfer curve etc.) This hampers a robust and reliable detection of the zero field crossings from a single AC AMR output signal.

Because the transfer curve is not purely anti-symmetric (about the point 203), even order distortion components arise. In other words, if a sinusoidal field $H_{ext}$ is applied to the sensor, a spectral analysis (FFT) on the AMR sensor output resistance shows not only the odd harmonics from a purely anti-symmetric transfer curve but also some even harmonics resulting from the (shifted) symmetrical nature of the transfer curve.

One known approach to address these problems is the use of barber poles in the AMR sensors. These force current flow in the sensors to follow a certain direction. Barber poles are lines of very conductive material that are placed at an angle of 45 degrees with the AMR element. Their purpose is to make the current flow under 45° in the region between the barber poles. Since the AMR effect is dependent on the angle between the current direction and the magnetisation direction, the barber poles enable the sensor output to be linearised (and therefore very sensitive) around zero magnetic field.

To manufacture an AMR sensor, two dies are typically used. One IC-die contains the ASIC and one die contains the magnetoresistive part of the sensor. The reason for such a two-die solution is amongst others that the magnetic elements might contaminate the IC clean room and they might diffuse into the active silicon during processing or during the product lifetime. This will certainly inhibit the proper functioning of the IC.

It is known that it would be desirable to integrate the magnetic sensor on top of active silicon (i.e. the IC) to reduce packaging costs, reduce the number of bond pads and to make matching of magnetic/electrical elements easier and more accurate. This is especially significant if the sensor uses one or more Wheatstone bridge arrangements, which is the conventional way to implement a sensor circuit. This should be possible by using proper diffusion barriers.

The connections to the AMR element in the sensors are typically provided on top of the AMR element. The required processing can damage the AMR element in the areas where it is used as the sensor. The same applies to the interconnects between the AMR elements and the barber pole structures placed on top of the AMR elements.

There is therefore a need for a simplified processing method which reduces possible damage to the IC (due to the plasma processing steps) and the possible damage to the AMR element itself.

According to the invention, there is provided a magnetoresistive (MR) sensor arrangement, comprising an MR sensor and an integrated circuit formed on the same semiconductor wafer, wherein the arrangement comprises:

a metal layer which is patterned to define at least first and second contact regions;

first metal connecting plugs extending down from the first and second contact regions of the metal layer for making contact to terminals of the integrated circuit;

a magnetoresistive material layer above the metal layer and separated by a dielectric layer, which defines an MR element arrangement comprising at least one AMR element;

second metal connecting plugs extending up from the first and second contact regions of the metal layer to ends of the MR element arrangement.

The invention provides the integration of an IC and an MR sensor on a single wafer. The connections to the MR sensor element(s) are defined as metal plugs before the MR sensor material is deposited and patterned.

Thus, structures are provided in the top layers of the IC by using metal plugs and a metal layer, and this is carried out in the back-end processing stage (i.e. after completion of the components of the integrated circuit). By providing the connection structures beneath the AMR element and not on top of it, the number of processing steps for contacting the MR element is reduced, and therefore also the possible damage to the IC due to the plasma processing steps, and the possible damage to the MR element itself since no processing needs to be performed onto the magnetic element. This enables an increase in yield.

The structure can have interconnects between multiple MR elements, and/or barber poles on the MR element. All these connections are provided first by metal-plugs (e.g. W or Cu) and a metal layer of the IC in the CMOS back-end process.

Thus, firstly the MR element arrangement can comprise at least two MR sensor elements, and the metal layer then further comprises at least one interconnect region for connecting MR sensor elements, with the second plugs also extending up from the at least one interconnect region of the metal layer to ends of the AMR elements to be connected. Thus, some of the second plugs provide the end connections to the AMR sensor arrangement and others of the second plugs provide internal interconnects between MR sensor elements.

Secondly, the metal layer can be patterned also to define barber pole conducting lines, and the metal connecting plugs then further comprise plugs extending up from the barber pole conducting lines to the MR element arrangement.

The integrated circuit preferably comprises a CMOS circuit and the metal layer comprises the CMOS top metal layer. The first and second plugs can comprise tungsten or copper, and the use of such plugs as via interconnects between conducting layers in a CMOS structure is a well known and commercially used technique.

The plugs can for example have a diameter of 100 to 500 nm and are configured as an array with pitch less than double the diameter.

A coil can also be formed in the metal layer, and this can be used to provide an external field, for influencing the characteristics of the sensor arrangement.

The invention also provides a method of forming a magnetoresistive (MR) sensor arrangement, comprising an MR sensor and an integrated circuit formed on the same semiconductor wafer, wherein the method comprises:

during manufacture of the integrated circuit:
  patterning a metal layer to define at least first and second contact regions;
  forming first metal connecting plugs extending down from the first and second contact regions of the metal layer and making contact to terminals of the integrated circuit; and
  forming second metal connecting plugs extending up from the first and second contact regions of the metal layer; and
forming a magnetoresistive material layer above the metal layer and separated by a dielectric layer, and patterning the layer to define an AMR element arrangement comprising at least one AMR element, wherein the AMR element arrangement connects to the second metal plugs.

This method provides the patterning of all the contacts before the magnetoresistive layer is deposited, and thereby enables the sensor formation to be part of the back end manufacturing process.

A CMP (chemical mechanical planarisation) step is preferably performed to provide planar top contacts at the surfaces of the second plugs before forming the magnetoresistive material layer.

Examples of the invention will now be described in detail with reference to the accompanying drawings, in which.

The invention provides a magnetoresistive sensor arrangement integrated with an IC. The sensor is for sensing the strength and/or direction of an external magnetic field. This external magnetic field may for example rotate with an object for which the angular orientation is to be sensed.

A metal layer of the IC structure (e.g. CMOS) is patterned to define at least first and second contact regions. Metal connecting plugs are provided below the first and second contact regions of the metal layer for making contact to terminals of the integrated circuit. A magnetoresistive material layer is above the metal layer and separated by a dielectric layer. Second metal connecting plugs extend up from the metal layer to the magnetoresistive material layer (sensor layer). The sensor layer is thus formed over the top of the layers of the IC structure. The invention can be applied generally to magnetoresistive sensors, but is of particular interest for anisotropic MR sensors.

Before describing the invention in detail, a known processing method will first be described, with reference to FIG. 3.

Figure 3:
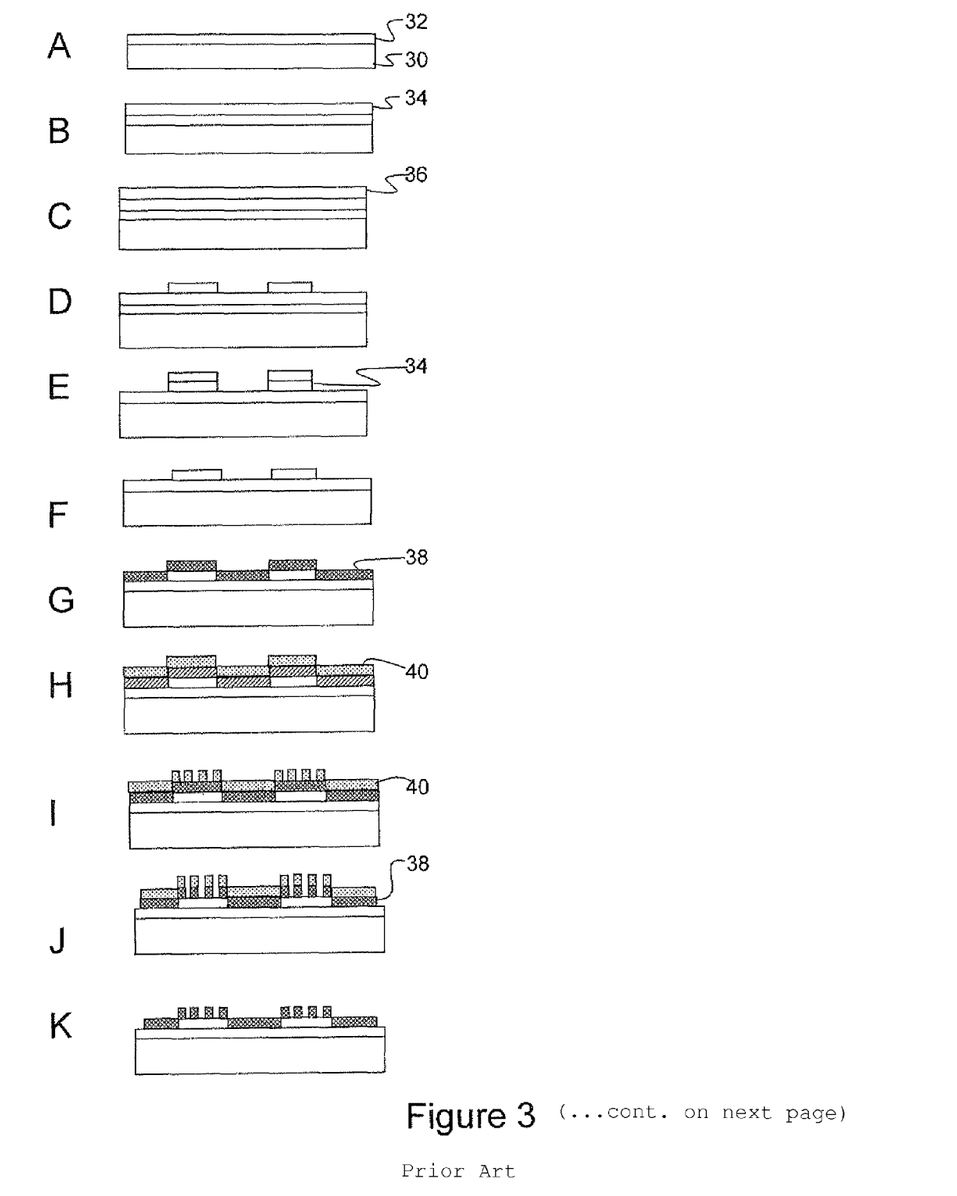
FIG. 3 shows a known method of manufacturing an AMR sensor.

FIG. 3 shows the processing for a sensor that contains barber poles and interconnects between two AMR elements. It is often magnetically more favourable to split the magnetoresistive element up into several smaller elements and to connect them electrically to each other. These elements need to be electrically connected to each other.

FIG. 3 is not drawn to scale and only 2 barber poles per AMR element are shown.

Step A shows a wafer 30 with dielectric 32 (e.g. $SiO_2$) on top of it.

Step B shows a layer of magnetic material 34 (normally permalloy, $Ni_{80}Fe_{20}$) deposited.

Step C shows photoresist 36 applied.

Step D shows the photoresist having been structured. In Step E the permalloy 34 is etched and then in Step F the photoresist is stripped.

The barber pole and interconnect material 38 is then deposited (for example Al with a diffusion barrier such as TiW below) as shown in Step G.

In Step H, photoresist 40 is applied and this is structured as shown in Step I. This forms openings of the desired shape and 45 degree orientation for the barber poles, as also shown The barber pole and interconnect material 38 is then etched as shown in Step J and the photoresist 40 is stripped as shown in Step K.

A passivation layer 42 is deposited as shown in Step L, photoresist 44 is applied (Step M) and structured (Step N) to form contact openings.

The passivation layer 42 is then etched to free up the contact to the sensor as shown in Step O. Finally the photoresist is stripped. The resulting structure is shown in Step P. The contacts are shown as 46 for two AMR elements 48 interconnected by an interconnect 50, and each AMR element has barber poles 52.

In this processing route, the magnetic layer might be attacked by etchants in step J.

Furthermore the steps B,G,J are plasma steps (that can damage a possible underlying IC). Steps E and O can be plasma etch steps or wet etch steps.

There have been proposals for methods which avoid damage to the magnetic layer. Examples can be seen in U.S. Pat. Nos. 6,850,057 and 6,048,739, but these methods increase significantly the complexity of the process and/or do not remove the risk of damage during the process.

The invention provides a process which enables connection of the MR elements to the IC in a way which avoids damage to the IC and to the MR sensor layer. The method can also be used to enable barber poles to be formed (if desired) as well as connections between multiple MR elements (if required). In addition, a coil can be formed underneath the MR elements with the same process. These structures are present beneath the MR element instead of on top of it.

Figure 4:
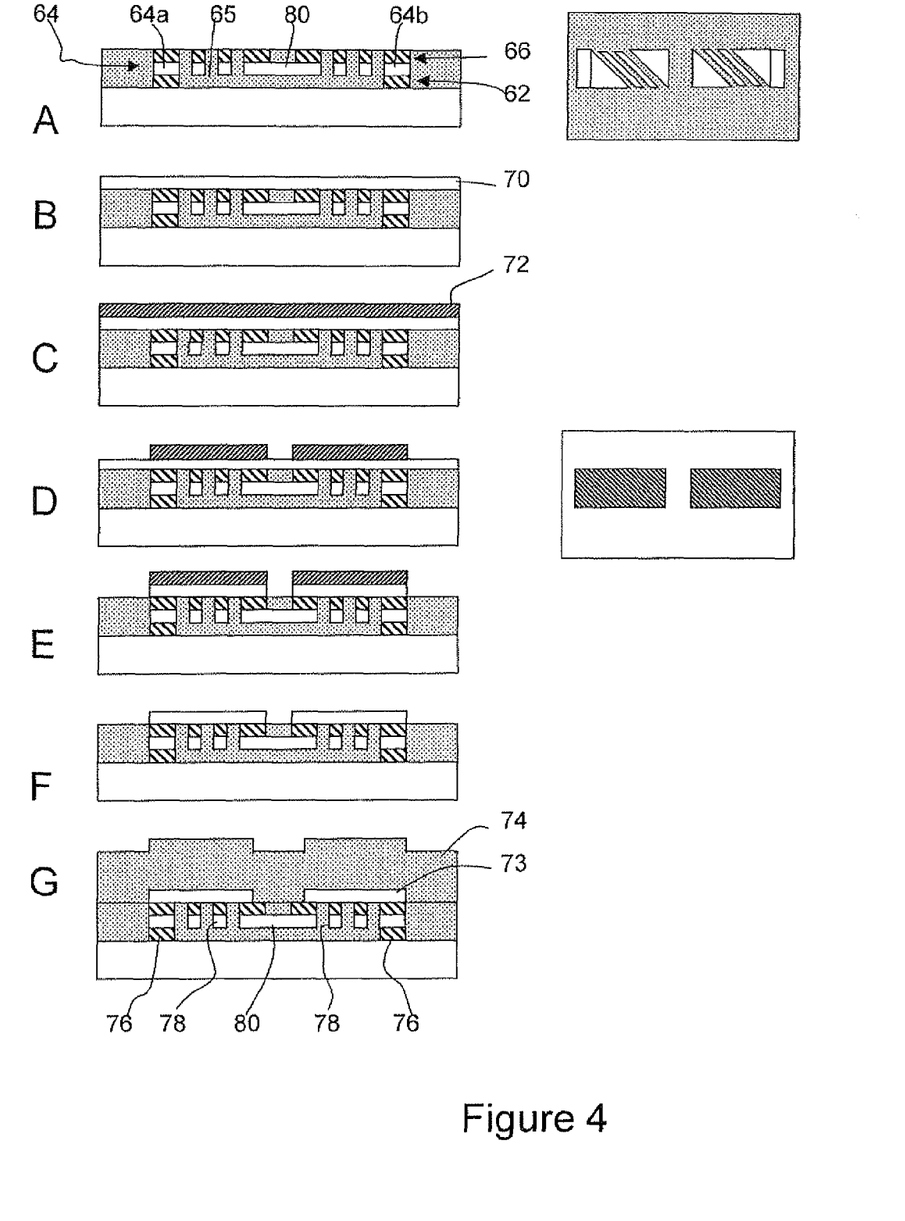
FIG. 4 shows an example of method of manufacture of the invention and the resulting device of the invention.

An example of the process flow is shown in FIG. 4, for an AMR sensor arrangement.

The starting point, shown in Step A, is a CMOS wafer containing areas with many metal plugs 60 at the appropriate places. These areas are indicated in the figure schematically as large metal areas. In reality they consist of many small W-plugs close to each other (for example 250 nm diameter with a mutual spacing of 250 nm)

There is one layer 62 of plugs beneath the top metal layer 64 of the IC and one layer 66 of plugs above the top metal layer 64. The plugs are formed through a dielectric layer 65. The plugs form the connection to the IC for the resistive sensor elements, as well as interconnects between resistive elements (if there are multiple elements), and barber poles (of they are desired). There may be more than one metal layer used in the structure. The plugs and the dielectric are at the same level to ensure proper contacting and to obtain a good quality AMR layer. The metal layer 64 has portions 64a,64b which will be used to make contact with the AMR sensor elements (i.e. contact regions) as well (optionally) as an interconnect region 80 for connecting multiple AMR sensor elements together. This will be apparent from the description further below.

The structure shown in Step A is formed by the following processing steps:

First a dielectric layer is deposited on top of the semiconductor device, for example by a chemical vapour deposition (CVD) process.

Contact holes are defined and etched in the dielectric layer to provide contacts with the underlying metal layer of the semiconductor device. After cleaning, a sputter etch process (e.g. Ar ion bombardment) is used to clean the metal in the bottom of the contacts. Next, without a vacuum break, a 20 nm Ti layer and subsequently a 80 nm TiN layer is sputter deposited over the substrate. This step is followed by a Chemical Vapour Deposition (CVD) of a W layer from the reduction of $WF_6$ with $H_2$.

This will fill the contacts with W. Chemical Mechanical Polishing (CMP) is applied to remove the W, the TiN and the Ti layer on the planar areas, leaving W in the contacts so forming the W plug.

In essentially the same process, the filling of the contacts can instead be carried out using Cu. In this case, after the sputter etch process a Ta(N) layer and a Cu layer is sputter deposited over the substrate. Next an electrochemical Deposition (ECD) of Cu from a dedicated $CuSO_4$ solution is performed to fill the contacts with Cu. Chemical Mechanical Polishing (CMP) is applied to remove the Cu and the Ta(N) layer on the planar areas, leaving Cu in the contacts so forming the Cu plug.

In a next step the top metal layer is sputter deposited. Most often this is a Ti/TiN/Al layer. This layer is typically patterned by dry etching. On top of this top metal layer again a dielectric layer is deposited, new contact holes are deposited and the plug process is repeated.

This process of forming plugs within a CMOS process is conventional and does not form part of the invention. Indeed, other methods for forming the plugs and top metal layer can be used, and the method of connecting the AMR sensor layer is accordance with the invention can still be applied.

The plan view of the structure is also shown for Step A, to show the barber pole 45 degree orientation, which is formed as metal stripes in the top metal layer. Gaps between the stripes reveal the sensor area.

In Step B, the AMR layer 70 is deposited.

A resist layer 72 is deposited in Step C and is structured in Step D. The plan view is also shown, and the resist layer corresponds in shape to the individual AMR elements 73. The AMR material is then etched as shown in Step E.

The photoresist layer is stripped off in Step F and a passivation layer 74 is deposited in Step G.

The resulting structure has bottom contacts 76 to an IC, barber poles 78 and an interconnect 80 between two AMR sensors.

The contacts between the IC and the AMR element can be made low ohmic enough by having many metal plugs in parallel (each of the W-plugs has typically a 5 Ohm resistance in a conventional (advanced) BiCMOS process, they have a diameter of 250 nm and can be placed at 250 nm from each other). The same is true for the interconnect between two AMR elements: many metal plugs can be placed in parallel on both ends of the elements. The plugs all lead to the top metal layer of the back end of the wafer which has a very low resistance (typically 30-40 mOhm/square in a BiCMOS process).

For the barber poles, many plugs will again be placed in parallel, all connected to each other by the top metal layer of the BiCMOS structure. However the equipotential lines around these plugs will be concentric. This is shown in FIG. 5A.

Figures 5A, 5B:
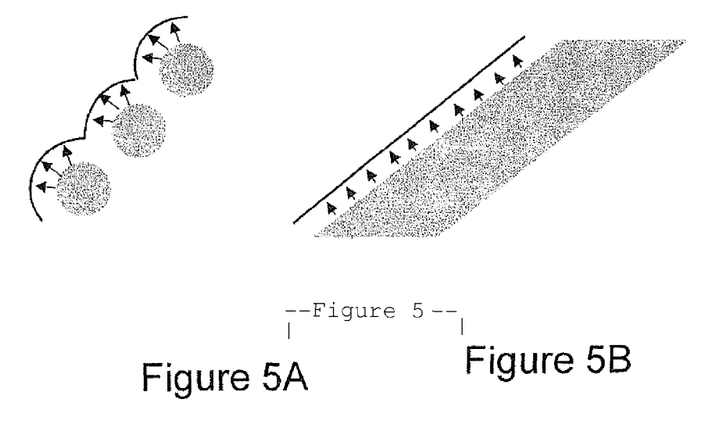
FIG. 5 is used to explain the effect of the invention on the functioning of the barber poles.

This means that the current very near to the outer row of the plugs will not be at 45° with respect to the AMR element, as is the case with a normal barber pole processing route (FIG. 5B). This effect dies out further away from the outer row of plugs. Its effect is almost negligible at a distance equal to the pitch between the plugs (in the case of BiCMOS, typically 250 nm). This is much less than the typical distance between barber poles (around 4 microns), and therefore the effect on the output of the sensor is very limited.

The processing method of the invention has another effect. In a conventional "dedicated-die" AMR structure in which the barber pole is directly on top of the AMR element, the current will flow immediately through the barber pole because of its low resistance in comparison to the AMR material (1000 times less resistance). This is not true for the structure in which the top metal layer of the IC is connected via plugs to the AMR element.

An analysis has been conducted based on 13 W-plugs placed next to each other (this corresponds to the 4 micron width of the barber pole with a W-plug every 250 nm), and the resistance of the plugs being taken as 5 Ohm per plug. The sheet resistance of the AMR material is taken as 20 Ohm/square and of the metal layer 30 mOhm/square.

The results of the analysis show that after the first W-plug, 85% of the current is already flowing in the metal layer of the barber pole. After the second plug that is already 98%. In the middle of the structure the same factor of 1000 is reached as in the "classical" case with the barber pole immediately on top of the AMR structure.

Thus, the barber pole will function correctly (so that in the gap between the barber poles the current will be perpendicular to the barber pole). However the current will remain longer in the high ohmic magnetic layer as compared to the conventional case. Therefore the total resistance will increase slightly. If the current remains longer in the magnetic layer it may have a beneficial influence on the AMR effect, as the current is not so quickly short-circuited by the conducting barber pole material.

For many MR sensors it is beneficial to have a coil present on the same chip as the sensor. This coil can be used for modulating the magnetic field (see e.g. WO2009/040693) or for giving a reset pulse to the MR sensor (see e.g. U.S. Pat. No. 7,449,882). This coil is normally present on top of the MR sensor.

However it is also possible in the method of the invention to produce the coil in the top metal layer(s) of the IC, immediately beneath the MR sensor.

A similar processing route can be followed, but in this case the contacts to the coil are provided directly to the IC and no extra plugs will be present on the surface of the IC wafer before depositing the MR layer.

In the processing route above, the magnetic layer is deposited after the connections are already established, thereby avoiding extra processing steps to produce these connections.

The magnetic material is protected from any etch-damage because all contacts are already established at the end of the BiCMOS processing and therefore no etch-processing steps on top of the magnetic material are needed.

This processing route has the advantage that it can produce contacts to the IC, barber poles and interconnect between MR elements and a coil can be present underneath the sensor. The processing route needs less processing steps giving a reduction of cost. It has a smaller number of potentially dangerous processing steps for the IC and for the MR element itself (yield). The influence on the performance of the sensor is limited: only small deviations of the current direction in the area very close to the edges of the barber poles.

The detailed composition of the individual MR (AMR or other) sensor elements has not been given, as these are completely conventional. An AMR sensor element is a device which operates based on the property of a material in which a dependence of electrical resistance on the angle between the direction of electrical current and orientation of magnetic field is observed. The effect is attributed to a larger probability of s-d scattering of conduction electrons in the direction of the magnetization. The net effect is that the electrical resistance has maximum value when the direction of current is parallel to the magnetization direction. AMR effects of up to 50% have been observed in some ferromagnetic uranium compounds.

The electrical connection of MR elements to form a sensor has not been described, and this does not form part of the invention. An MR sensor is typically formed as a Wheatstone bridge circuit of four magnetoresistive elements. The four resistors should (at zero magnetic field) be perfectly matched; however due to processing a small offset exists. This offset can be laser-trimmed but this is an expensive solution. With the sensor integrated on top of the IC, the matching can be done more accurately and over a larger resistance offset range by the IC itself.

The IC components have not been shown or described as they are completely conventional. Connection between contacts 76 and the desired IC components is within the CMOS structure and implemented in routine manner.

Various modifications will be apparent to those skilled in the art.

The invention claimed is:

1. A magnetoresistive (MR) sensor arrangement, comprising:
   an MR sensor and an integrated circuit formed on a same semiconductor wafer;
   a metal layer which is patterned to define at least first and second contact regions and an interconnect region;
   a plurality of first metal connecting plugs extending down from the first and second contact regions of the metal layer to terminals of the integrated circuit;
   a magnetoresistive material layer above the metal layer and separated from the metal layer by a dielectric layer, which defines an MR element arrangement having first and second MR elements, each element including first and second ends on laterally opposing sides of the MR element; and
   a plurality of second metal connecting plugs including
      a metal connecting plug extending up from the first contact of the metal layer to the first end of the first MR element,
      a metal connecting plug extending up from the second contact region of the metal layer to the first end of the second MR element, and
      respective metal connecting plugs extending from the interconnect region to the second ends of the first and second MR elements.

2. A sensor arrangement as claimed in claim 1, wherein the second plugs are configured and arranged with a relative spacing from one another to exhibit equipotential concentric field lines around the plugs.

3. A sensor arrangement as claimed in claim 1, wherein the metal layer is patterned also to define barber pole conducting lines, and wherein the second metal connecting plugs further comprise plugs extending up from the barber pole conducting lines to the MR element arrangement.

4. A sensor arrangement as claimed in claim 1, wherein the integrated circuit includes a CMOS circuit.

5. A sensor arrangement as claimed in claim 4, wherein the metal layer includes a CMOS top metal layer of the CMOS circuit.

6. A sensor arrangement as claimed in claim 1, wherein the first and second plugs comprise at least one of tungsten and copper.

7. A sensor arrangement as claimed in claim 1, wherein the plugs have a diameter of 100 to 500 nm and are configured as an array with a pitch less than double their diameter.

8. A sensor arrangement as claimed in claim 1, further comprising a coil formed in the metal layer.

9. A method of forming an MR sensor arrangement having an MR sensor including first and second magnetoresistive (MR) elements, and an integrated circuit formed on the same semiconductor wafer, the method comprising:

during manufacture of the integrated circuit:

patterning a metal layer to define an interconnect region and at least first and second contact regions;

forming a plurality of first metal connecting plugs extending down from the first and second contact regions of the metal layer to terminals of the integrated circuit;

forming a plurality of second metal connecting plugs including a metal connecting plug extending up from the first contact region of the metal layer to a first end of the first MR element, a metal connecting plug extending up from the second contact region of the metal layer to a first end of the second MR element, and respective metal connecting plugs extending from the interconnect region to second ends of the first and second MR elements; and forming a magnetoresistive material layer above the metal layer and separated from the metal layer by a dielectric layer and the plurality of second metal connecting plugs, and patterning the layer to define an MR element arrangement comprising the first and second MR elements, each element including the first and second ends on laterally opposing sides thereof.

10. A method as claimed in claim 9, wherein forming the plurality of second metal plugs includes forming the second plugs with a relative spacing from one another to exhibit equipotential concentric field lines around the plugs.

11. A method as claimed in claim 9, wherein patterning the metal layer also defines barber pole conducting lines, and wherein the second metal connecting plugs further comprise plugs extending up from the barber pole conducting lines to the MR element arrangement.

12. A method as claimed in claim 9, wherein the integrated circuit is formed with a CMOS process.

13. A method as claimed in claim 9, wherein the first and second plugs comprise at least one of tungsten and copper.

14. A method as claimed in claim 9, further comprising a coil formed in the metal layer.

15. A method as claimed in claim 9, further comprising a chemical mechanical planarisation step to provide planar top contacts at surfaces of the second plugs before forming the magnetoresistive material layer.

16. A method as claimed in claim 9, wherein the at least first and second contact regions and the interconnect region are patterned in the metal layer in a single process step.

* * * * *